United States Patent [19]
Ootake

[11] Patent Number: 5,900,581
[45] Date of Patent: May 4, 1999

[54] RESIN SEALING STRUCTURE FOR ELEMENTS

[75] Inventor: Kenichi Ootake, Tokyo, Japan

[73] Assignee: NEC Corporation, Tokyo, Japan

[21] Appl. No.: 08/934,401

[22] Filed: Sep. 19, 1997

[30] Foreign Application Priority Data

Sep. 20, 1996 [JP] Japan .................................. 8-249623

[51] Int. Cl.⁶ .................................................. H01L 23/28
[52] U.S. Cl. .......................... 174/52.2; 257/778; 257/791
[58] Field of Search .................................. 174/52.2, 52.4, 174/260; 257/667, 687, 738, 787, 788, 791, 778; 29/841, 855, 856

[56] References Cited

U.S. PATENT DOCUMENTS 5,336,931  8/1994  Juskey et al. ............................ 257/787
5,428,188  6/1995  Dozier ..................................... 174/52.2
5,535,101  7/1996  Miles et al. .............................. 361/808

OTHER PUBLICATIONS

Paper A380 presented at the Convention of the institute of Electronics, Information and Communication Engineers, 1995.

*Primary Examiner*—Kristine Kincaid
*Assistant Examiner*—Hung V. Ngo
*Attorney, Agent, or Firm*—Scully, Scott Murphy and Presser

[57] ABSTRACT

A resin sealing structure according to the invention has convex parts formed in the vicinities of the perimeters of elements on a substrate to prevent thereby the resin, when it is applied for sealing, from invading the wiring parts of the elements. There may be narrow enough gaps between the substrate and the elements not to allow the resin to enter. This structure enables resin sealing to be accomplished at a high yield and dispenses with metallic caps or the like.

4 Claims, 1 Drawing Sheet

RESIN SEALING STRUCTURE FOR ELEMENTS

BACKGROUND OF THE INVENTION

Field of the Invention

The present invention relates to flip chip mounting of elements, and more particularly to a resin sealing structure for elements, such as acoustic surface wave elements and GaAs elements, whose electric characteristics are changed by any foreign matter sticking to the surface.

Flip chip mounting of elements according to the prior art is accomplished by forming bumps on pads on the surface of elements, and connecting those bumps to pads on the substrate side. After the flip chip mounting, the gap between each element and the substrate is sealed with resin to ease stress, prevent the invasion of foreign matter and protect the bumps. However, if any foreign matter sticks to the surface of a GaAs element or a surface acoustic wave element, which is operable at a high frequency, the desired electric characteristics cannot be obtained, and therefore the gap between the substrate and the element should have an airtight structure, with the element covered with resin all around.

To meet this requirement, a structure in which the gaps between the substrate and the elements are made airtight is formed by dropping a resin of high viscosity type, which would not enter into the gaps between the substrate and the elements, on the elements and hardening it.

For instance, in an example described in Paper A380 presented at the 1995 Convention of the Institute of Electronics, Information and Communication Engineers, after bumps are formed on semiconductors, the heights of bumps are made uniform, an electroconductive adhesive is transcribed on them, and the semiconductors are flip chip-mounted into cavities in the substrate. After that, insulating resin is applied around the elements and, after the resin is hardened, solder sealing is formed with metallic caps.

However, in a structure wherein flip chip-mounted elements are covered with resin as in this example, since the resin enters through the gaps between the substrate and the elements to come into contact with the electrode pattern, signals often cannot flow, resulting in a failure to achieve the desired characteristics.

Moreover, a structure using insulating resin or metallic caps involves many constituent parts and many manhours spent to fit them, resulting in poor productivity and impossibility to supply inexpensive products.

SUMMARY OF THE INVENTION

An object of the present invention is to obviate the aforementioned disadvantages and provide a sealing structure for elements, which is simple and permits inexpensive resin sealing at a high yield.

According to the invention, there is provided a resin sealing structure for elements, wherein elements and a substrate are electrically connected to each other with prescribed spacing in-between. Convex parts (hereinafter called dams) are formed on said substrate, and the dam and the perimeter of each element are sealed with resin. The substrate and the elements are arranged so that their faces on which wiring is to be formed be opposite to each other and are electrically connected to each other. The dams are formed near the perimeters of the elements on the substrate surface; and the dams and the perimeters of elements are sealed with resin.

The elements and the dams may either be in direct contact with each other or have between them gaps which are narrow enough not to allow much resin to enter. The resin may cover the elements all over. The dams should preferably be made of the same material as the substrate, but they may as well be of a different material.

The invention, as the dams provided on the substrate prevent the resin from invading the gaps between the substrate and elements, enables the yield of the resin sealing of flip chip-mounted elements to be enhanced.

Moreover, since the structure is simple, using no such parts as metallic caps, the heat radiating structure of the elements can be realized with fewer manhours and at a lower material cost.

BRIEF DESCRIPTION OF THE DRAWINGS

The above-mentioned and other objects, features and advantages of the present invention will become more apparent from the following detailed description when taken in conjunction with the accompanying drawings, wherein.

Figure 1:
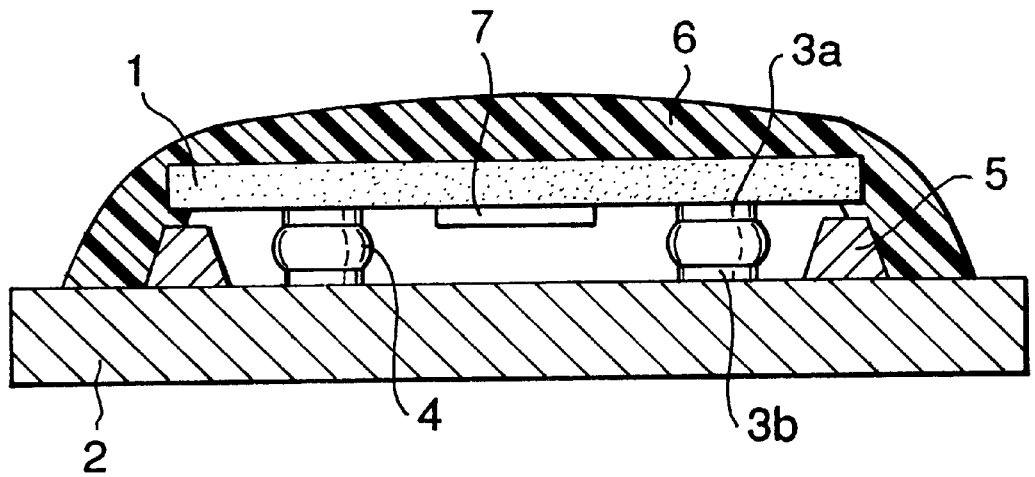
FIG. 1 shows a cross section of an example of element mounting structure according to the invention.
Figure 2:
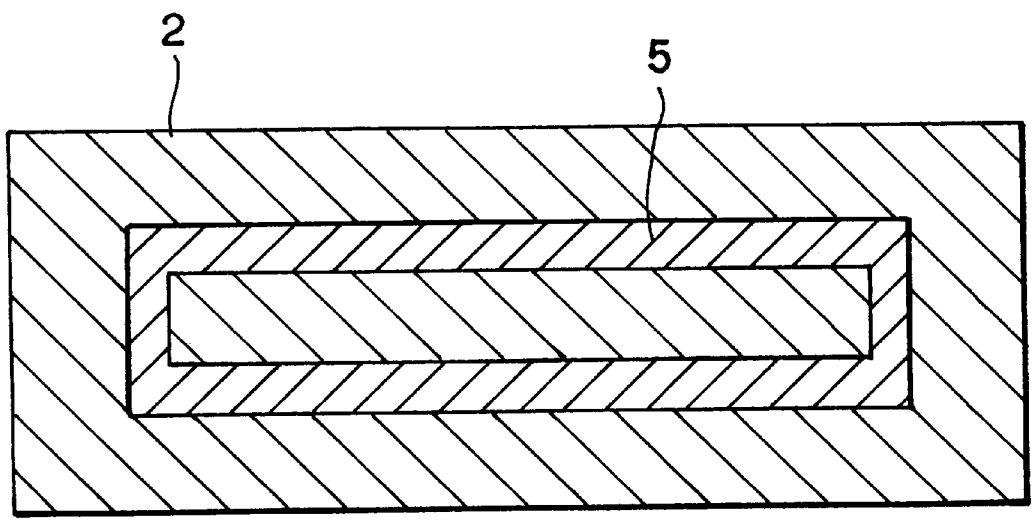
FIG. 2 shows a plan of a substrate on which a dam is formed according to the invention.

In the drawings, identical reference signs denote identical structural elements.

DETAILED DESCRIPTION OF THE PREFERRED EMBODIMENT

Next will be described in detail a preferred embodiment of the invention with reference to drawings. Referring to FIG. 1, an element 1 is flip chip-mounted on a substrate 2 on which a dam 5 is formed. The structure is such that resin 6 overspreads the element 1 and the gap between the element 1 and the substrate 2 is airtight. The dam 5 is shaped like a frame which is convex on the substrate 2; its exterior size is about equal to that of the element 1, and its height from the substrate is about $10\mu$ lower than the gap height after the flip chip mounting of the element 1 and the substrate 2.

The smaller height of the dam 5 than the gap between the element 1 and the substrate 2 represents a safety margin to prevent the element 1, when it is to be connected to the substrate 2 by Au bumps, from coming into contact with and being damaged by the dam 5. If there is no fear of the element being affected, it may eventually come into contact with the dam 5 after the element 1 and the substrate 2 are connected to each other.

Next will be described in detail the manufacturing method of the resin sealing structure according to the invention. First, Au bumps 4 are formed on pads 3a on the element side, and connected to pads 3b on the substrate side to accomplish flip chip mounting. The shape of each pad may, for example, be rectangular, having sides of $100\mu$ to $400\mu$ in length. If, for instance, the element 1 is a surface acoustic wave device, ten to eight pads having $400\mu$ sides are formed per element. Or if the element is a gallium-arsenic high frequency element, pads having $100\mu$ sides are used.

Possible methods of connection include an Au/Au pressure fitting method and a soldering method of connection by supplying solder to the pads 3b on the substrate side. Au/Au pressure fitting is achieved by pressing Au bumps 4 under heating against Au-plated pads 3b on the substrate, which results in mutual diffusion of Au on both sides and joining of the Au bumps 4 and the pads 3b on the substrate side, which electrically connects the substrate 2 and the element 1.

By the soldering method, solder is supplied over the pads 3b on the substrate side and connecting the heated bumps 4 of the element 1 to the pads 3b on the substrate side. Solidification of the solder by cooling after melting connects the Au bumps 4 to the pads 3b on the substrate side with the solder, and thereby electrically connects the substrate 2 and the element 1.

The dam 5 on the substrate 2 is formed, if the material of the substrate 2 is a ceramic (usually alumina-glass ceramic), from a similar ceramic or, if it is epoxy, from epoxy by printing and heating. If a ceramic is used, a mixture of ceramic powder and an organic binder is screen-printed and fired. An epoxy dam can as well be formed on a ceramic substrate or else a seal shaped in advance to serve as the dam 5 can be stuck to the substrate.

The external shape of the dam 5 is in a frame form of the same planar size as the external shape of the element 1, and its height is less than the height of the gap between the substrate 2 and the element 1 to allow for a safety margin. If, for example, the element measures 6 mm by 8 mm, and the gap between the substrate 2 and the element 1 is 50 μm high, the planar size of the dam 5 should be 6 mm by 8 mm and the height should be approximately 40 μm. Yet, the element 1 and the dam 5 need not be identical in shape. The width of the dam frame should be 150 to 200 μm.

After that, the resin 6 is dropped from above the element 1 to seal the element 1 with resin. In this process, a commercially available epoxy resin of high viscosity and low thermal expansion was used as the resin 6. As the dam 5 formed on the substrate 2 prevents the resin from invading the gap between the substrate 2 and the element 1, there is no such invasion and the gap is made airtight. The material to be used as the resin 6 should have a low thermal expansion coefficient after hardening so as to minimize the stress after the flip chip mounting of the element 1, and emit no large quantity of gas during the hardening process so that the electrodes be prevented from corrosion. The resin 6 was subjected to heat treatment for a few hours in a temperature range of 100° C. to 150° C.

Although the above-described preferred embodiment is an example in which the resin 6 covers the elements 1 all over, it is also permissible to seal only the perimeters of the elements 1 with resin.

While the invention has been described with reference to a specific preferred embodiment thereof it is to be understood by those skilled in the art that the subject matter encompassed by the invention is not limited to this specific embodiment. Instead, it is intended for the subject matter of the present invention to cover all such alternatives, modifications and equivalents as can be included within the spirit and the scope of the appended claims.

What is claimed is:

1. A structure for sealing an electronic element comprising:
    a substrate;
    an electronic element electrically connected to said substrate by a plurality of bumps forming a space between said substrate and said electronic element;
    a convex part formed on said substrate opposite a perimeter of said electronic element, wherein said element and said convex part are spaced from each other; and
    a resin forming a seal around the perimeter of the element and the convex part.

2. The structure of claim 1 wherein the convex part and the substrate are formed of the same material.

3. The structure of claim 1 wherein the resin covers the entirety of the element.

4. The structure of claim 1 further including a plurality of elements electrically connected to said substrate, a convex part formed on said substrate opposite the perimeter of each element and a resin forming a seal around the perimeter of the each element and convex part.

* * * * *